United States Patent
Liu et al.

(10) Patent No.: US 10,361,250 B2
(45) Date of Patent: Jul. 23, 2019

(54) ACTIVE OPTICAL DEVICE ENABLED BY DIELECTRIC METAMATERIALS

(71) Applicant: National Technology & Engineering Solutions of Sandia, LLC, Albuquerque, NM (US)

(72) Inventors: Sheng Liu, Albuquerque, NM (US); Igal Brener, Albuquerque, NM (US); Michael B. Sinclair, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 0 days.

(21) Appl. No.: 16/156,497

(22) Filed: Oct. 10, 2018

(65) Prior Publication Data

US 2019/0051770 A1  Feb. 14, 2019

Related U.S. Application Data

(62) Division of application No. 15/184,929, filed on Jun. 16, 2016, now Pat. No. 10,128,387.

(60) Provisional application No. 62/182,381, filed on Jun. 19, 2015.

(51) Int. Cl.
| | |
|---|---|
| *H01L 27/15* | (2006.01) |
| *H01S 5/40* | (2006.01) |
| *H01S 5/343* | (2006.01) |
| *H01L 27/144* | (2006.01) |
| *G02B 1/00* | (2006.01) |

(52) U.S. Cl.
CPC ............ *H01L 27/156* (2013.01); *G02B 1/005* (2013.01); *H01L 27/1446* (2013.01); *H01S 5/343* (2013.01); *H01S 5/34366* (2013.01); *H01S 5/4025* (2013.01)

(58) Field of Classification Search
CPC ............... H01L 27/1446; H01L 27/156; H01L 31/035236; H01L 33/30; H01L 31/0304; H01S 5/34366; H01S 5/343
See application file for complete search history.

(56) References Cited

U.S. PATENT DOCUMENTS

| | | | |
|---|---|---|---|
| 8,803,637 B1 | 8/2014 | Peralta et al. | |
| 9,374,887 B1 | 6/2016 | Warne et al. | |
| 2005/0040410 A1* | 2/2005 | Ledentsov | H01L 33/105 257/79 |
| 2008/0079016 A1* | 4/2008 | Kovsh | H01L 27/15 257/98 |

(Continued)

OTHER PUBLICATIONS

Gin, J., et al., "Realizing Optical Magnetism from Dielectric Metamaterials", Physical Review Letters, 2012, 097402, vol. 108.

(Continued)

*Primary Examiner* — Tuan N Nguyen
(74) *Attorney, Agent, or Firm* — Martin I. Finston

(57) ABSTRACT

An array of dielectric resonators is formed on a substrate. Each resonator includes an active medium having an optical transition that is operative in a process of photodetection or photoemission. The active media each include a quantum well multilayer. The dielectric resonators in the array are each dimensioned to provide a resonance that lies substantially at the frequency of the optical transition.

12 Claims, 17 Drawing Sheets

(56) References Cited

U.S. PATENT DOCUMENTS

| | | | | |
|---|---|---|---|---|
| 2013/0240251 A1* | 9/2013 | Kaplan | ............. | H01Q 7/00 174/254 |
| 2014/0059830 A1* | 3/2014 | Morel | ............. | H01S 5/18377 29/428 |

OTHER PUBLICATIONS

Wu, C., et al., "Fano-resonant asymmetric metamaterials for ultrasensitive spectroscopy and identification of molecular monolayers", Nature Materials, 2011, pp. 69-75, vol. 11.

Singh, R., et al., "Ultrasensitive THz sensing with high-Q Fano resonances in metasurfaces", Applied Physics Letters, 2014, 171101, vol. 105.

Wu, C., et al., "Spectrally selective chiral silicon metasuraces based on infrared Fano resonances", Nature Communications, 2014, 3892, vol. 5.

Zhao, W. et al., "Fano resonance in all-dielectric binary nanodisk array realizing optical filter with efficient linewidth tuning", Optic Express, 2015, pp. 6858-6866.

Wang, F., et al., "Switchable and non-switchable zero backscattering of dielectric nan-resonators", Optical Materials Express, 2015, pp. 668-675, vol. 5.

Warne, L. K., et al., "Perturbation Theory in the Design of Degenerate Rectangular Dielectric Resonators", Progress in Electromagnetics Research B, 2012, pp. 1-29, vol. 44.

Warne, L. K., et al., "Perturbation Theory in the Design of Degenrate Spherical Dielectric Resonators", IEEE Transactions on Antennas and Propagation, 2013, pp. 2130-2141, vol. 61.

Campione, S., et al., "Tailoring dielectric resonator geometires for directional scattering and Huygens' metasurfaces", Optic Express, 2015, pp. 2293-2307, vol. 23.

Yang, Y., et al., "All-dielectric metasurface analogue of electromagnetically induced transparency", Nature Communications, 2014, 6753.

Choquette, K. D., "Advances in Selective Wet Oxication of AlGaAs Alloys", IEEE Journal of Selected Topics in Quantum Electronics, 1997, pp. 916-926, vol. 3.

Person, S., et al., "Demonstration of Zero Optical Backscattering from Single Nanoparticles", Nano Letters, 2013, pp. 1806-1809.

Wolf, O., et al., "Enhanced optical nonlinearities in the near-infrared using III-nitride heterostructures coupled to metamaterials", Applied Physics Letters, 2015, 151108, vol. 107.

Liu, S. et al., "III-V seminconductor nano-resonators—a new strategy for passive, active, and nonlienar all-dielectric metamaterials", Physics Optics, 2016, arXiv:1605-00298.

Campione, S., et al., "Second harmonic generation from metamaterials strongly coupled to intersubband transitions in quantum wells", SAND20150857.

Campione, S. et al., "A New Monolithic Dielectric Resonator Metasurface Design for High Quality-Factor Fano Resonances", SAND20157994.

Campione, S., et al., "A New Monolithic Dielectric Resonator Design for High Quality-Factor Fano Resonances", SAND20152713A.

Campione, S., et al., "Tailoring the Properties of Dielectric Resonator-Based Metamaterials", SAND20142360.

Neshev, D., et al., "Shaping Emission Spectra of Quantum Dots by All-dielectric Metasurfaces" SAND20140510C.

Liu, S., et al., "2D and 3D all dielectric metamaterials made from III-V semiconductors" SAND20160861C.

Liu, S., et al., "Nonlinear Optical Metasurfaces—dielectric metasurfaces", SAND 20162869.

Sinclair, M., "High Quality Factor Fano Metasurfaces" SAND20159143.

Campione, S., et al., "Tailoring Dielectric Resonator Geometires for Directional Scattering, Huygens' Metasurfaces, and High Quality-Factor Fano Resonances", SAND20161722C.

Sinclair, M. B., et al., "Broken Symmetry Dielectric Resonators for Scalable, High Quality-Factor Fano Metasurfaces", SAND20162089A.

Sinclair, M. B., "High Quality-Factor, All-Dielectric, Fano Metasurfaces at Near Infrared Frequencies", SAND20162090.

Campione, S. et al., "Broken symmetry dielectric resonators for high quality-factor Fano metasurfaces" SAND20162525J.

* cited by examiner

ACTIVE OPTICAL DEVICE ENABLED BY DIELECTRIC METAMATERIALS

RELATED APPLICATIONS

This application is a divisional of the commonly owned U.S. patent application Ser. No. 15/184,929, filed Jun. 16, 2016 by Sheng Liu et al. under the title "Optoelectronic Apparatus Enabled by Dielectric Metamaterials".

The abovesaid application Ser. No. 15/184,929 claims the benefit of the earlier filing date of U.S. Provisional Patent Application No. 62/182,381, filed Jun. 19, 2015 and hereby incorporated herein by reference, in its entirety, for all purposes.

Some of the subject matter of this application is related to the subject matter of commonly owned U.S. Pat. No. 9,685,765, which issued to Michael B. Sinclair et al. on Jun. 20, 2017 under the title, "High Quality-Factor Fano Metasurface Comprising a Single Resonator Unit Cell", and which is hereby incorporated herein by reference, in its entirety, for all purposes.

Some of the subject matter of this application is related to the subject matter of commonly owned U.S. Pat. No. 10,054,839, which issued to Igal Brener et al. on Aug. 21, 2018 under the title, "Nonlinear Optical Frequency Conversion Using Metamaterial Arrays", and which is hereby incorporated herein by reference, in its entirety, for all purposes.

STATEMENT OF GOVERNMENT INTEREST

This invention was made with Government support under Contract No. DE-AC04-94AL85000 awarded by the U.S. Department of Energy. The Government has certain rights in the invention.

FIELD OF THE INVENTION

The invention relates to semiconductor devices that incorporate metamaterials.

ART BACKGROUND

Dielectric metamaterials have shown potential for use in a broad range of applications in ultra-thin optical components including flat lenses, wave plates, polarizers, and nonlinear optical frequency converters. However, the realization of dielectric metamaterial resonators at visible and near infrared frequencies has heretofore been mostly limited to implementations in silicon, which emits light inefficiently because it is an indirect bandgap material. There remains a need to implement dielectric metamaterials in direct bandgap semiconductors so that the new functionalities and improved levels of performance offered by dielectric materials can be realized in active resonant optical devices such as LEDs, lasers, detectors, and modulators.

SUMMARY OF THE INVENTION

We have developed novel optically resonant metamaterials that incorporate direct bandgap semiconductors such as III-V semiconductors, and we have shown that such metamaterials can display special properties that can be utilized for improved performance in active resonant optical devices. These novel metamaterials include arrays of dielectric resonators that incorporate active media. An active medium is a semiconductor material that has an optical transition that can be utilized in a photonic device such as a laser, light-emitting diode, photodetector, optical modulator, optical amplifier, or the like. Thus, the active medium may, for example, be an optical gain medium or a photoelectric or photoconductive medium.

Accordingly, the invention in an embodiment is an apparatus in which an array of dielectric resonators is formed on a substrate. Each of the dielectric resonators in the array comprises an active medium characterized by at least one optical transition in which light is emitted and/or absorbed at a frequency f and a vacuum wavelength $\lambda$. The dielectric resonators in the array are each dimensioned to provide a resonance that lies substantially at the frequency f.

The dielectric resonators exhibit Mie resonance. That is, they will couple strongly to an incident electromagnetic plane waves if the spatial dimensions of the resonator are comparable to the wavelength of the incident radiation. For resonance in low-order modes, the spatial dimensions of the resonators will generally be smaller than $\lambda$. For resonance in higher-order modes, the dimensions may be up to $10 \times \lambda$. The array may be two dimensional, but in other embodiments, stacking techniques can be used to make a three-dimensional array.

Some embodiments are designed to exhibit a Fano resonance at the frequency f. In these embodiments, there is a coupling within each resonator between resonant modes that tend to radiate on an axis perpendicular to the substrate and other resonant modes that tend to radiate parallel to the substrate. The coupling is causes by an asymmetrical feature that is built into each resonator. The array spacing is small enough to support mutual electromagnetic interactions among the resonators that tend to suppress radiation parallel to the substrate.

In some embodiments, an optical confinement layer having a relatively low refractive index lies beneath the resonator array. In examples, the optical confinement layer contains aluminum gallium oxide, which may be present as native material produced by oxidizing aluminum gallium arsenide.

A variety of materials and structures may be used for the active medium. Examples of active media include a quantum well multilayer, lattice-strained germanium, a III-V semiconductor, and a quantum dot or quantum dot array.

Because the individual resonator structures can be very small, they can potentially tolerate relatively large amounts of lattice strain. As a consequence, embodiments are possible in which germanium resonators or gallium arsenide or other III-V resonators are grown on a silicon substrate.

BRIEF DESCRIPTION OF THE DRAWINGS

FIG. 6 represents the electric field at an excitation wavelength of about 870 nm, and FIG. 7 represents the electric field at an excitation wavelength of about 1020 nm.

DETAILED DESCRIPTION

Optical metamaterials are structures that interact with electromagnetic radiation through surface features whose spatial scale is comparable to the wavelength of the interacting visible, infrared, or microwave radiation. These materials are currently the subject of intense interest because of their many potential applications in the modification and control of optical and microwave signals.

Some of the early optical metamaterials were fabricated as arrays of metallic resonators. Although useful, the metal structures have ohmic losses that tend to broaden the resonances at infrared and optical frequencies, which is disadvantageous for some applications. This disadvantage was partly overcome by the introduction of optical metamaterials based on dielectric resonators. A dielectric resonator is fabricated, for example, from a semiconductor and is excited at energies below the bandgap of the semiconductor, where the semiconductor typically exhibits desirable dielectric behavior.

As research on optical metamaterials progresses, new effects with potentially useful applications continue to be discovered. For example, we recently found a surprising enhancement in the predicted confinement of the resonant electric field within the resonator. This result arose from computer modeling of metamaterial structures. In an example described below, the structures include gallium arsenide (GaAs) and aluminum gallium arsenide (AlGaAs) layers grown on a GaAs substrate.

In an example, the initial workpiece for forming a GaAs—AlGaAs optical metamaterial is a layered structure consisting of a GaAs substrate overlain by 400 nm of epitaxially grown AlGaAs, followed by 300 nm of epitaxially grown GaAs. The aluminum in the AlGaAs layer is oxidized to AlGaO to reduce the refractive index of that layer to a value significantly below the refractive index of GaAs. (AlGaO is an aluminum-gallium oxide. Stoichiometric coefficients are not provided here because the precise composition may be variable.) That is, the refractive index of the native alumina produced in this manner is about 1.6, whereas GaAs has an index greater than 3.0 at typical near-infrared wavelengths. This has the desirable effect of confining the optical intensity profile (corresponding to the resonant optical modes) within the resonators. The workpiece is patterned and etched down to the top of the oxidized AlGaAs layer to form an array of cylinders formed with sub-wavelength dimensions, e.g. a diameter and height of several hundred nanometers for performance at 1-2 μm optical wavelength.

Figure 1:
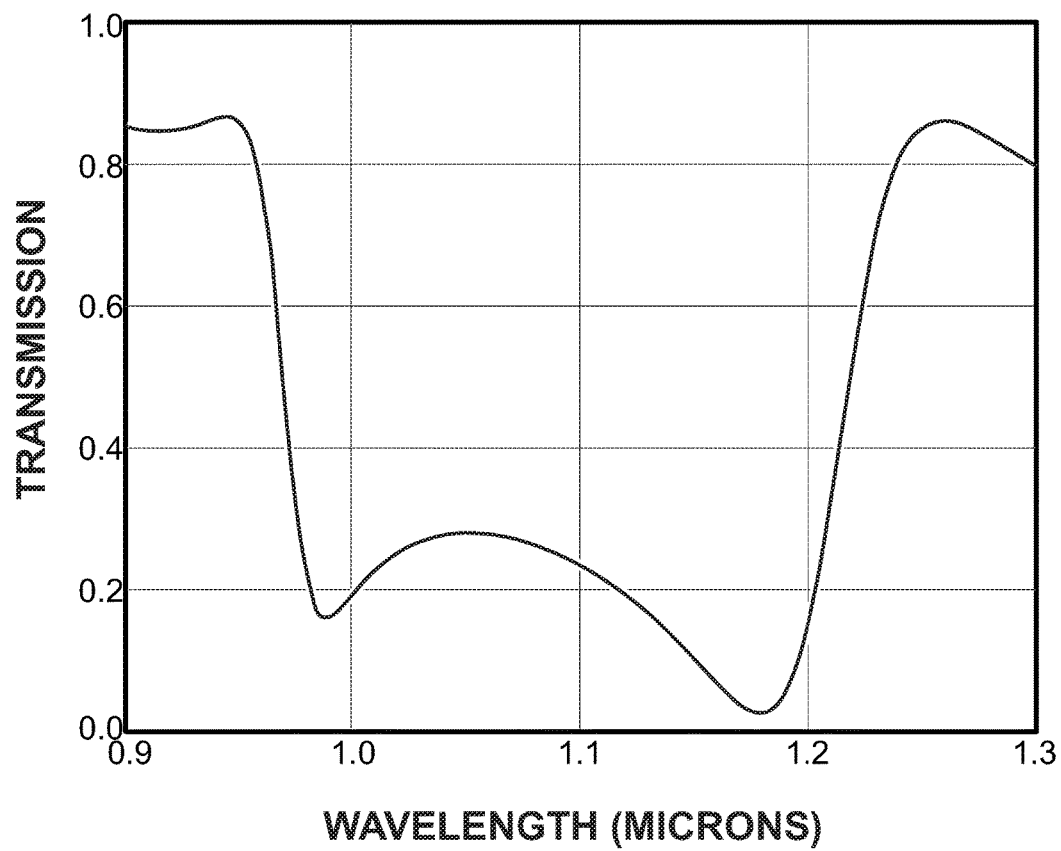
FIG. 1 is a theoretical transmission spectrum, obtained from simulations, of an array of cylindrical resonant structures formed in the shape of circular cylinders. Our studies predict that arrays of such resonators can exhibit enhanced optical properties, even without neighbor interactions or Fano resonances, when the resonator structures are made with sub-wavelength dimensions. It will be seen that there are resonances at about 980 nm and about 1170 nm.

FIG. 1 is the theoretical transmission spectrum, obtained from simulations, of an array of resonant structures of the kind described above. It will be seen that there are resonances at about 980 nm and about 1170 nm.

Figure 2:
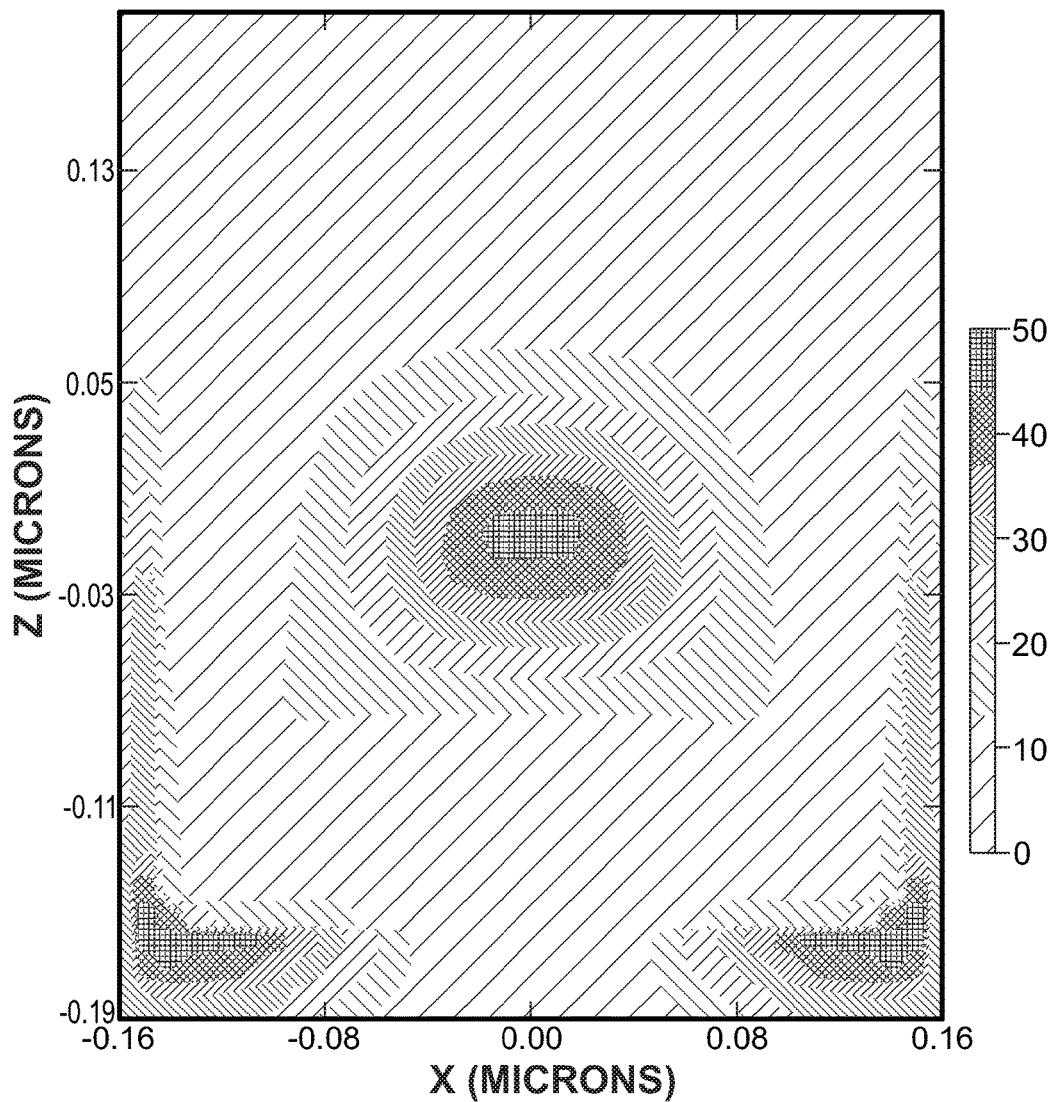
FIGS. 2 and 3 are theoretical two-dimensional contour plots, obtained from computational simulations, of the electric field intensity within a resonator of the array of FIG. 1 at respective excitation wavelengths of about 980 nm and about 1170 nm.
Figure 3:
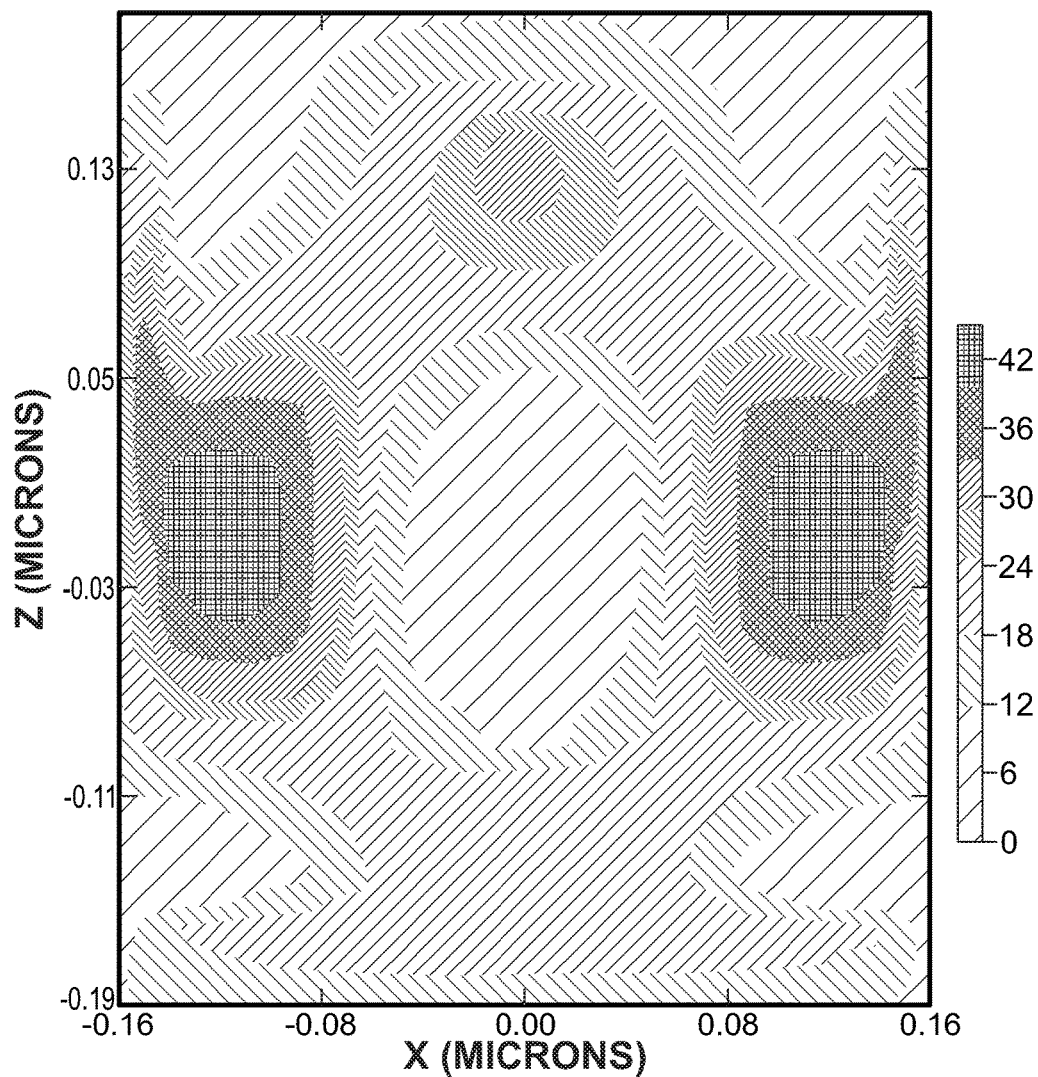

The enhancement in the electric field intensity within the resonator structure can be seen in FIGS. 2 and 3. FIG. 2 is a theoretical two-dimensional contour plot, obtained from simulations, of the electric field intensity within the resonator at about 980 nm. FIG. 3 is a similar two-dimensional contour plot of the electric field intensity within the resonator at about 1170 nm. The internal field is higher than the incident field because of the quality factor of the magnetic and electric dipole resonances of the structure.

In another example, the initial workpiece is patterned so as to achieve Fano resonances, which characteristically have extremely narrow spectral widths. These resonances are believed to arise because of coupling between the different dipole modes of the dielectric blocks that constitute the individual resonators, as will be explained below. As will be seen, modeling studies predict that Fano-resonant metamaterials can be designed to exhibit not only the internal field enhancements described above, but also transmission and reflection spectra that have extremely narrow features.

Figure 4:
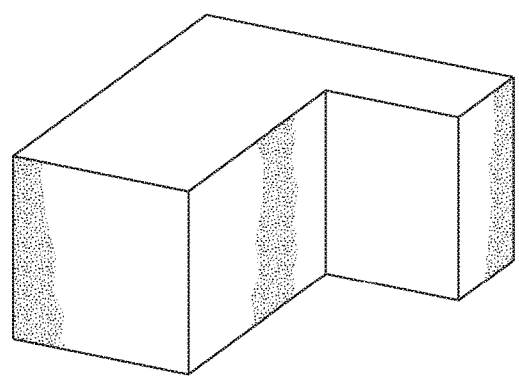
FIG. 4 is a sketch, not to scale, of a shape for a resonator that includes an asymmetric feature effective for coupling of different modes. In the figure, the asymmetric feature is a cut-out corner. Such a shape can be useful for producing resonator arrays that exhibit Fano resonance.

FIG. 4 is an example of a resonator structure designed to exhibit a Fano resonance when replicated as a unit cell in a two-dimensional array.

One notable feature of the resonator structure of FIG. 4 is that it is a monolithic dielectric body. By contrast, earlier published descriptions of dielectric resonators designed to exhibit Fano resonances have generally relied on two or more distinct, near-field coupled dielectric bodies within the unit cell. For example, a silicon-based design in which each unit cell contains a pair of coupled resonators is described in Y. Yang et al., "All-Dielectric Metasurface Analogue of Electromagnetically Induced Transparency," *Nature Commun.*, vol. 5, (2014) 6753-6759. Such a coupled-resonator design may be useful in some implementations of the new ideas presented here. However, the monolithic design will be advantageous in at least some cases because it relaxes the exacting fabrication tolerances needed by the coupled-resonator design for reliable and repeatable control of near-field coupling.

As seen in FIG. 4, one example of our resonator is a cube from which a corner has been cut out. In this example, the cutout extends through the entire thickness of the cube, and it has a length and width that are each one-half the side length of the cube. Accordingly, the cutout removes one-fourth the volume of the resonator in this non-limiting example.

The width, length and height dimensions of the resonator structure will typically be the designed Fano wavelength divided by the refractive index, so that the spatial dimensions are all less than the vacuum wavelength. However, larger dimensions can also be useful when excitation at higher-order resonant modes is desired.

Figure 5:
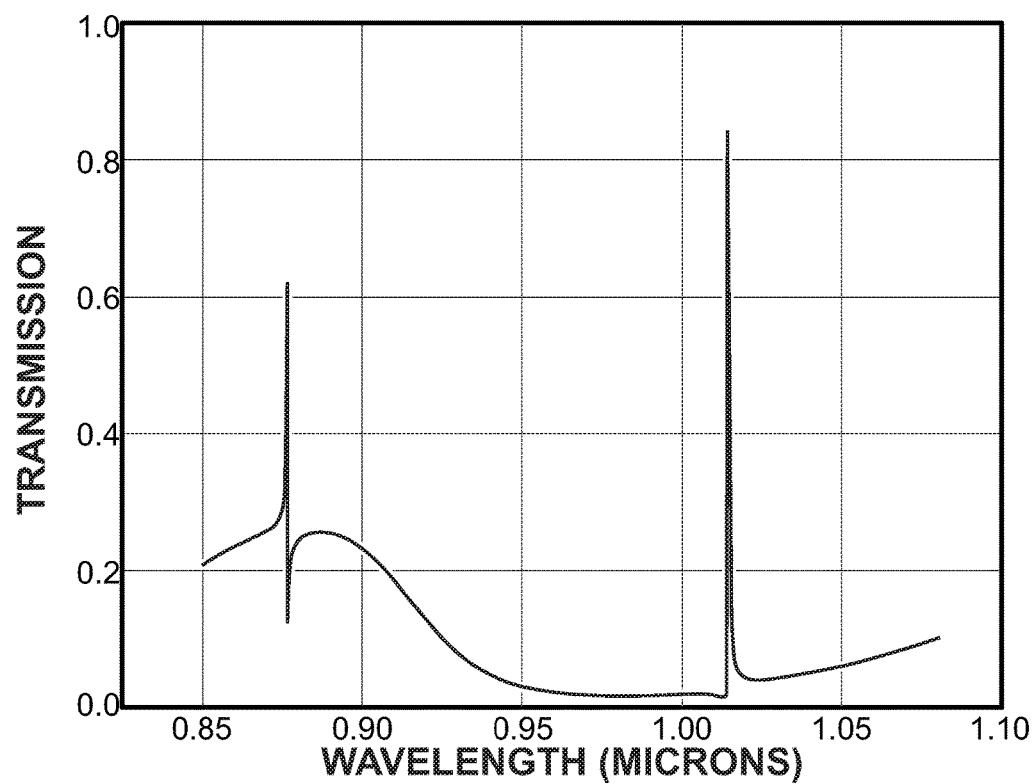
FIG. 5 is a theoretical transmission spectrum of an array of Fano-resonant structures that was obtained from computational simulations. Two Fano resonances are visible in the figure.

FIG. 5 is the theoretical transmission spectrum, obtained from computational simulations, of a Fano-resonant array of gallium arsenide resonator structures having corner cutouts as described above and designed to have a Fano resonance near 1 µm. The unit structure has a height of 300 nm, a width and length of 280 nm, and cutout dimensions 300 nm×70 nm×190 nm. It will be seen that there are resonances at about 870 nm and about 1020 nm. The quality factors of these resonances are greater than 1000.

Figure 6:
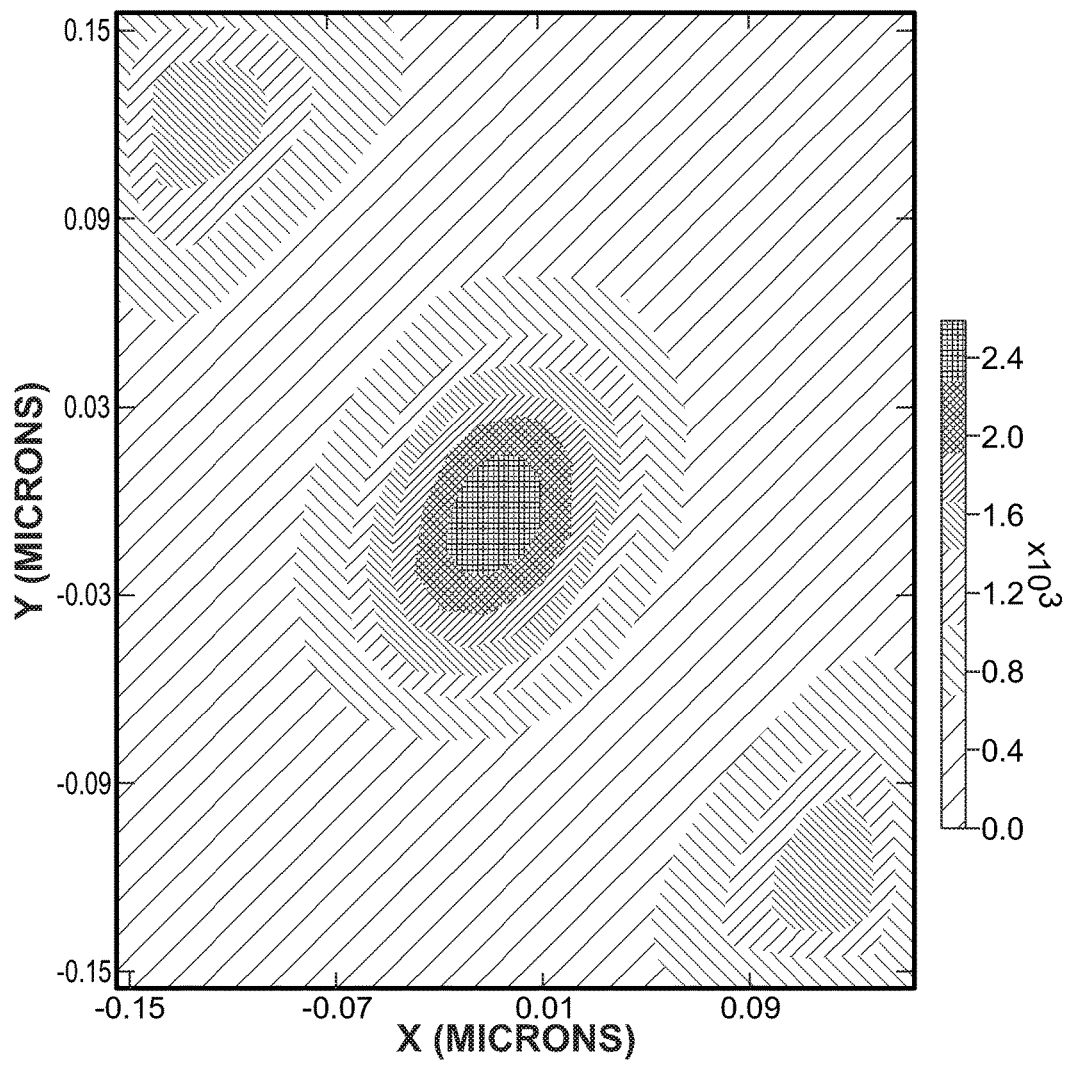
FIGS. 6 and 7 are theoretical two-dimensional contour plots, obtained from computational simulations, of the electric field intensity within a single resonator structure from a Fano-resonant array.
Figure 7:
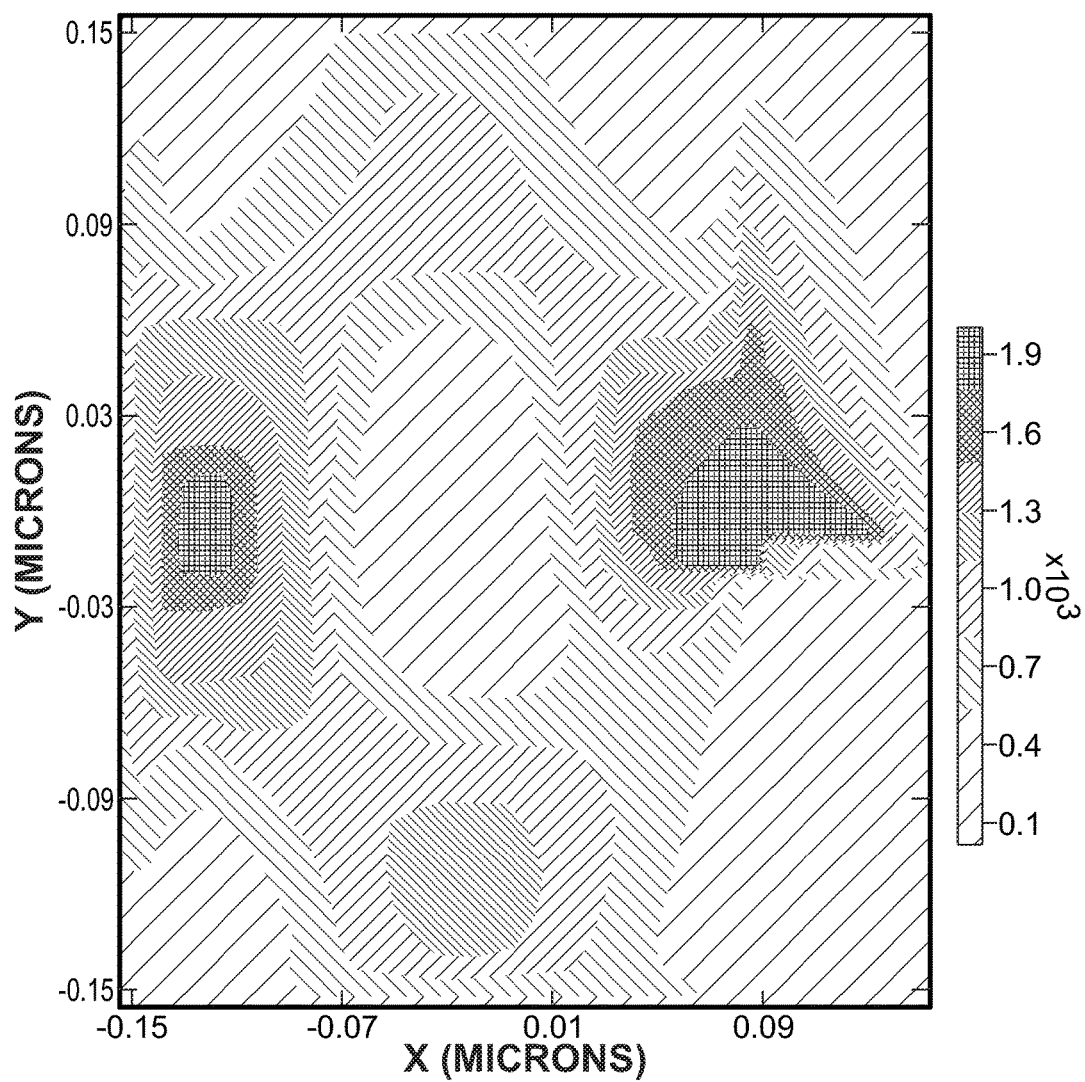

There is also a large enhancement in the electric field intensity within the resonator structure. This can be seen in FIG. 6, which is a theoretical two-dimensional contour plot, obtained from simulations, of the electric field intensity within the resonator at about 870 nm, and in FIG. 7, which is a similar two-dimensional contour plot of the electric field intensity within the resonator at about 1020 nm. The electric field intensities at both resonances are more than 2000 times the intensity of the incident wave, and we believe that they can be optimized still further.

By contrast, the modes that nominally tend to emit in a direction normal to the plane of the array still couple strongly to the external radiation and still have low quality factors. The resonator modes are orthogonal, hence the low-Q modes would not ordinarily couple to the high-Q modes. However, the corner cutout acts as a perturbation, creating a small coupling between the high-Q and low-Q modes. This results in the emergence of the very sharp Fano resonances in the transmission and reflection spectra.

From modeling studies, we believe that the collective effect that leads to an extremely high-quality factor in the resonances of Fano-resonant arrays may be achievable with a 10×10 array of resonator structures, and possibly even an array as small as 5×5 or even less.

It should be understood that a corner cutout in a cubic resonator structure is only one non-limiting example of a perturbation for the coupling of resonant modes. Various other resonator shapes, and various other perturbations that introduce asymmetry may also be used. In one example of alternative shapes, one vertical or nominally vertical side of the resonator is tilted about a vertical or horizontal axis.

In other examples, the resonator structure is a non-cubic rectangular prism. There could be different edge lengths along two, or even along all three principal axes. In non-cubic structures, it may be desirable to select the dimensions so as to produce modes that are sufficiently degenerate in energy to permit them to be coupled.

According to our current belief, it is not essential, in order to have Fano resonance, for the resonator body to be prismatic in shape. For example, a cut in a cylindrical resonator may also be an effective perturbation for the mode coupling that leads to Fano resonance.

In an example using non-cubic rectangular prisms, simulations predicted a Fano resonance in an array of L-shaped germanium resonators on a barium difluoride substrate. The resonator body was initially a rectangular prism 2.53 µm in height and 2.53 µm×3.06 µm in lateral dimensions. The initial shape was modified by cutting out a 1.265 µm×1.012 µm notch from one corner (extending through the full 2.53-µm height of the prism).

The array period was 4.2 µm. The simulated reflectivity spectrum of this array exhibited sharp features at about 9.6 µm and 10.8 µm that were indicative of Fano resonance.

As noted, the electric field within the resonator structure is highly enhanced, both in the structures exhibiting ordinary resonance and in the Fano-resonant structures described above. When active optical media are incorporated in the resonator structures, we believe that this field enhancement can lead to active optical and electro-optical devices having ultralow power consumption and other performance advantages relative to conventional counterparts.

For example, we believe that the field enhancement can potentially produce enhanced photoemission and photo-absorption, reduce lasing thresholds, and increase lasing power levels. It might also produce lasing in photo-emissive devices that do not normally have sufficient gain to cross the lasing threshold, or even make it possible to achieve lasing without any need for cavity mirrors. Because the resonant structures have multiple resonances, we believe that they can potentially be a basis for dual-wavelength and even for multiple-wavelength lasers.

Figure 8:
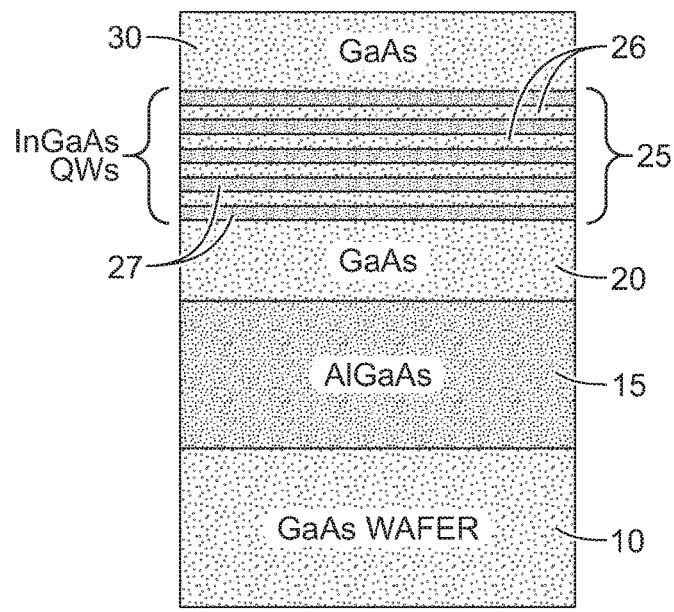
FIG. 8 is a schematic diagram of a layered resonator structure in which the active medium comprises a quantum well multilayer, according to an embodiment of the invention.

FIG. 8 provides an example of a resonator structure that incorporates an active medium. As explained above, by "active medium" is meant a semiconductor material that has an optical transition that can be utilized in a photonic device such as a laser, light-emitting diode, photodetector, optical modulator, optical amplifier, or the like.

In the example of FIG. 8, the active medium is a multi-layer of indium gallium arsenide (InGaAs) quantum wells in a gallium arsenide host on a gallium arsenide substrate. Quantum well multilayers useful in the present context can also be implemented in a variety of other material systems. One example uses indium gallium arsenide phosphide (InGaAsP) multilayers on an indium phosphide (InP) substrate. In such a layer, InGaAsP wells in which the alloy composition is adjusted to provide a lower bandgap are alternated with InGaAsP barrier layers in which the alloy composition is adjusted to provide a higher bandgap.

In other examples, the active medium is a quantum dot multilayer. Briefly stated, the main structural difference between a quantum well multilayer and a quantum dot multilayer is that in the well layers, granular growth of the well material leads to quantum dot formation. The grains typically grow to a diameter of about 10 nm or somewhat less. Of course, quantum dots have a band structure with different features from that of quantum wells because there is three-dimensional, rather than one-dimensional, carrier confinement. One example of a material system that supports quantum dot growth is one in which indium arsenide (InAs) wells alternate with GaAs barrier layers.

Of course, in still other examples, the active medium may be a bulk material, and it may even be coextensive with the resonator body itself.

Turning back to the example of FIG. 8, a feature of confinement-type active media (e.g. quantum well and quantum dot multilayers) worth mentioning is that the useful optical transitions supported by structures of this kind tend to have energies that are less than the bandgap of the host material. In the quantum well multilayer of FIG. 8, for example, the resonant transitions due to the InGaAs quantum wells will typically have wavelengths longer than the wavelength associated with bandgap-energy transitions in the gallium arsenide host.

Accordingly, the resonator body will in at least some cases be dimensioned to support resonance at one or more wavelengths associated with transitions in the gain medium, without supporting resonance at the shorter wavelength associated with the host band-gap energy. One advantage of such a design is that in at least some cases it can reduce loss from the overall resonator structure.

With further reference to FIG. 8, it will be seen there that a layered structure consists of a GaAs substrate 10 overlain in sequence by 300 nm layer 15 of AlGaAs, base layer 20 of approximately 100 nm of GaAs, a quantum well multilayer 25 of five periods of InGaAs quantum wells (QWs), and a cap layer 30 of GaAs approximately 100 nm thick. Two-dimensional arrays of metamaterial resonators can be fabricated in this structure using standard lithographic processes. For operation in the near infrared, example resonator structures are cylinders or modified cubes or the like having lateral dimensions of several hundred nanometers.

The 100-nm base layer 20 of GaAs forms the lower half of the resonator. The quantum-well multilayer 25 forms the middle portion of the resonator, and the upper 100-nm cap layer 30 of GaAs forms the upper half of the resonator.

Each quantum-well period consists of one layer 26 of GaAs and one layer 27 of InGaAs. The III-V layers are deposited by, e.g., MOCVD or MBE. The layer thicknesses are typically in the range 1-20 nm, but may be varied according to known principles in order to achieve desired effects. The resonator structures can be defined by a standard lithographic process flow such as electron-beam patterning and development, followed by metal deposition, lift-off, and dry etching. For longer operating wavelengths, e.g. mid-infrared wavelengths, photolithography can be used. The etch will typically extend all the way to the surface of the GaAs substrate 10, but it can optionally stop at the top of the 300-nm AlGaAs layer 15 or within that layer.

In embodiments, it is advantageous for the 300-nm-thick AlGaAs layer 15 to have a high aluminum mole fraction, for example a mole fraction greater than 80%. The aluminum can be oxidized to alumina (i.e., in AlGaO as explained above) to reduce the refractive index of layer 15 to a value significantly below the refractive index of GaAs. This has the desirable effect of confining the optical intensity profile (corresponding to the resonant optical modes) within the resonators.

Oxidation of AlGaAs is described, for example, in Kent D. Choquette et al., "Advances in Selective Wet Oxidation of AlGaAs Alloys", *IEEE J. Sel. Topics in Quant. Electr. Vol.* 3, *No.* 3 (June 1997) 916-926, the entirety of which is hereby incorporated herein by reference. Briefly, the oxidation is a one-step process in which the samples are introduced to an oxidation furnace where several gases flow through the samples at high temperature. Complete oxidation of the AlGaAs is effective for achieving the desired mode confinement. Simulations indicate that partial oxidation can also be effective.

In alternative material systems in which the oxidation step is not feasible, similar optical confinement can be achieved using flip-chip attachment. A known method of flip-chip attachment is described, for example, in the article S. Person et al., "Demonstration of Zero Optical Backscattering from Single Nanoparticles," *Nano Letters* 13 (2013) 1806-1809. In the work reported there, an epitaxial lift-off technique was used in conjunction with a water-bonding procedure to attach a high-quality GaAs membrane, which was grown on a gallium arsenide substrate, to a fused silica substrate. For that work, directly growing gallium arsenide on fused silica was disfavored because it would create a high density of dislocations.

In other examples of flip-chip attachment, assembly is by well-known processes, using a thin layer of adhesive or other material to adhere the confinement substrate to the resonator substrate.

Methods of flip-chip attachment would be desirable, for example, when it is desired to layer an indium gallium arsenide active layer over an indium phosphide substrate, or over a low-index substrate such as glass or sapphire. One reason that indium gallium arsenide is of interest is that it can serve as a bulk active medium.

Figure 9:
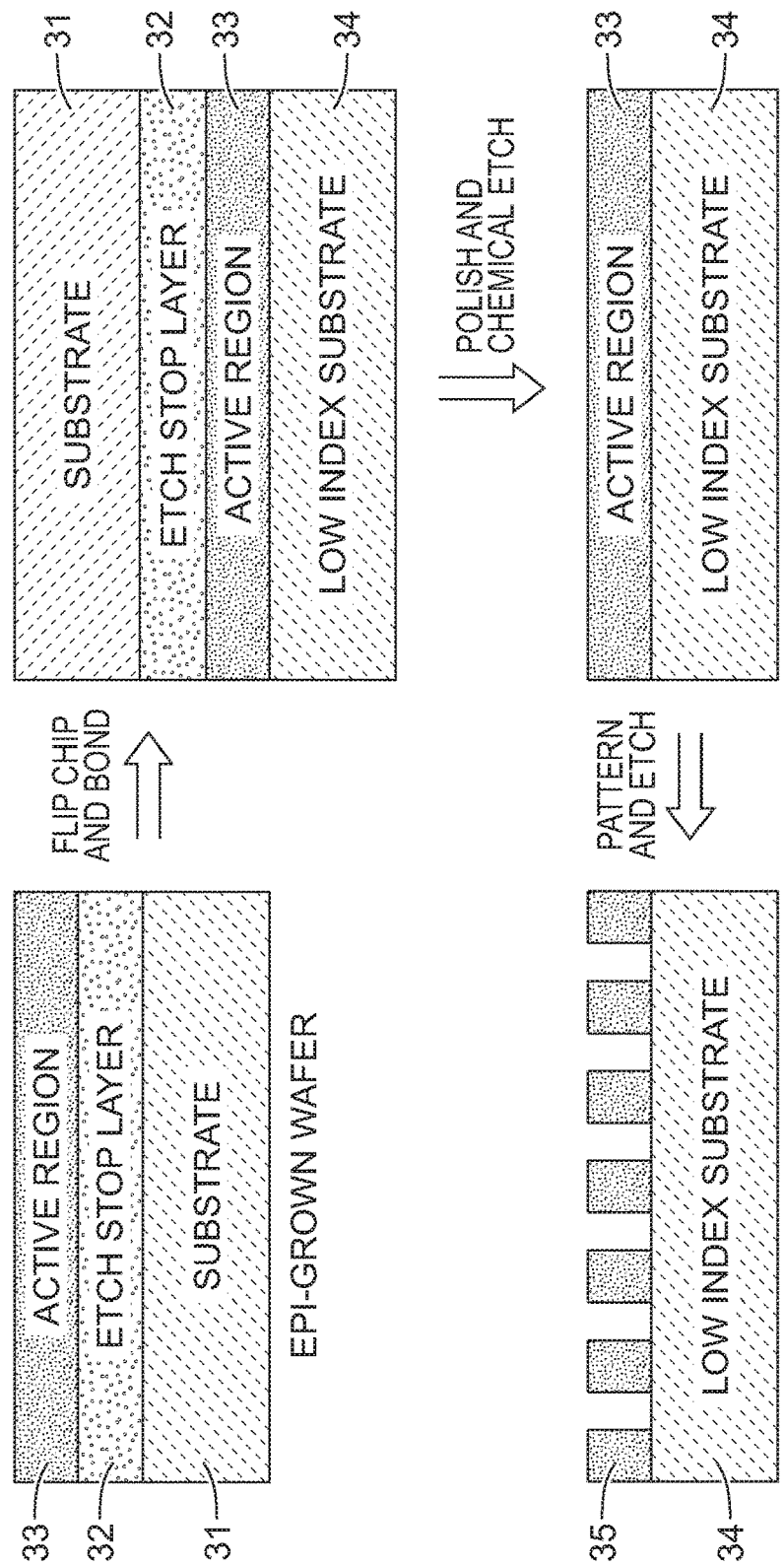
FIG. 9 is a flowchart containing sequential, schematic cross-sectional views that illustrate a flip-chip method of assembling a resonant array. The illustrated method is useful when, e.g., in-situ oxidation to produce an optical confinement layer is not feasible.

FIG. 9 illustrates another method of flip-chip attachment. As seen in the figure, an epitaxially grown starting wafer includes a substrate 31, an etch-stop layer 32, and an active region 33. A low-refractive index substrate 34 is provided for use as the optical confinement layer and also as a handle for the active region. Low-index substrate 34 is flip-chip bonded to the top of the starting wafer, i.e., to the face of active region 33 distal substrate 31. For the purpose of bonding, a thin adhesion layer may be added. Substrate 31 and etch-stop layer 32 are removed from the assembly by polishing and chemical etching. Active region 33 is then patterned and etched to produce the desired resonator structures 35. For clarity of presentation, several steps have been omitted from this discussion. Various procedures for the omitted steps are conventional and will be known to those skilled in the art.

Turning back to FIG. 8, it should be noted that the base layer 20, described above as consisting of GaAs, can alternatively be composed of AlGaAs having a low aluminum concentration. The precise mole fraction of aluminum is not critical, provided that when the 300-nm-thick AlGaAs layer 15 is oxidized, the base layer will oxidize much more slowly. This is achievable because the rate of oxidation varies exponentially with the aluminum concentration. Reference is made, in this regard, to FIG. 8 of the paper by Kent D. Choquette et al. cited above.

The oxidative procedure described above and the process of flip-chip described above are non-limiting examples of processes that be useful for providing an optical confinement layer that has a lower refractive index than the constituent materials of the array of dielectric resonators.

In some implementations, the resonant structures are operated as photodetectors. In other implementations they are operated as lasers or other photo-emitters. In some implementations, a multiplicity of resonant structures is partitioned between a sub-array for photoemission and a subarray for controlling the photoemission by, e.g. imposing static directionality or by enabling beam steering. Conversely, there may be a sub-array for photo-absorption and a sub-array for enhancing the photo-absorption or for controlling the directionality of the device in operation as a photodetector by imposing static directionality or enabling beam-steering.

It is important to note that similar structures can be created in other III-V material systems such as InAs, InP, InSb, GaSb, and various III-nitrides, as well as in II-VI material systems. It is also important to note that the multilayer dielectric resonator structures (both III-V and II-VI) can be fabricated directly on CMOS-compatible silicon substrates, because the resonators have ultra-small lateral dimensions and can accommodate the strain associated with the lattice mismatch. This provides one potential solution to the difficulties of incorporating light sources onto silicon wafers.

We also believe it would be possible to achieve germanium-based light sources using the techniques described here. That is, the resonator geometries that we describe here can be scaled down to a regime where a substantial amount of lattice mismatch can be accommodated. At those scales, lattice mismatch can be used to impart strains to germanium resonators sufficient to produce direct bandgap behavior and hence photon emission. For example, a quantum-well multilayer composed of germanium wells enclosed between silicon barriers can be included within a germanium host layer. Moreover, even without the quantum-well multilayer, the germanium structure could be capable of bulk photon emission if under sufficient lattice strain.

The approaches described here are highly scalable. Devices made using the techniques described here can be made for applications from the visible spectral range out to wavelengths as great as 2 μm and even farther into the mid-infrared spectral range, depending on the choice of material system. It should also be understood that the optical transitions that can potentially be utilized include bandgap absorption and emission, and as explained above, they can also include as well as absorption and emission at energies associated with an included confinement structure that are lower than the bulk bandgap energy of the host material.

Figure 10:
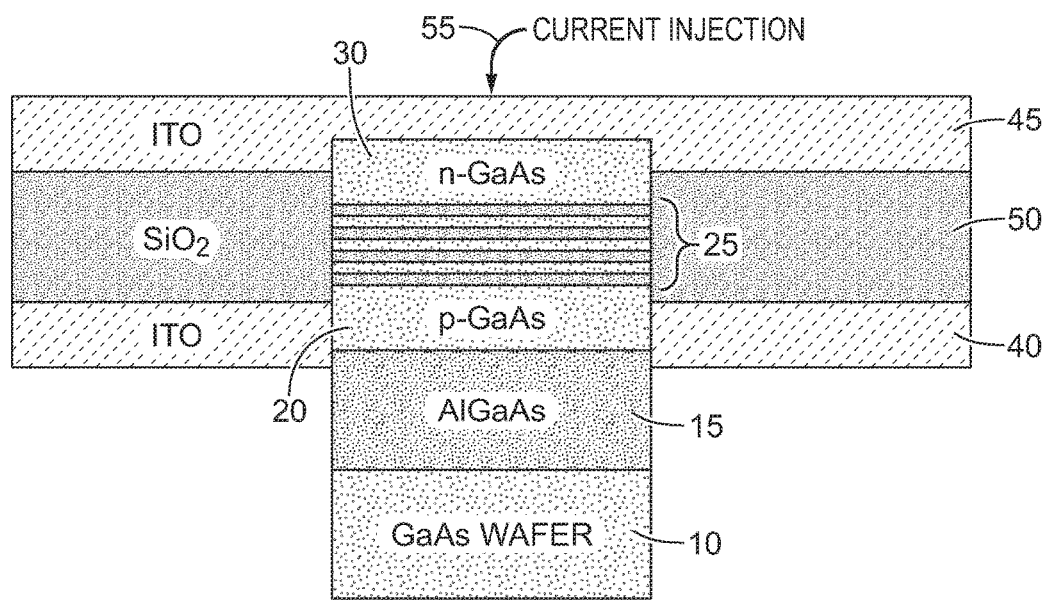
FIG. 10 is a schematic diagram in which an overlying structure is added to the layered resonator structure of FIG. 8. The overlying structure includes electrical contact layers and can be used for current injection or current extraction.

FIG. 10 provides a schematic diagram illustrating an overlying structure that can be used for current injection into the multilayer resonant structures in order to energize them as, e.g., photodetectors or lasers. In an example, the GaAs cap layer 30 overlying the multiple-quantum-well (MQW) active region 25 is doped n-type and the GaAs layer 20 lying below the MQW active region is doped p-type. Because refractive index contrast is needed to preserve the mode confinement in the resonator structure, it is advantageous to use a layer of indium tin oxide (ITO), which has a refractive index of 1.31 at a wavelength of 1 μm, for both the p-type contacts 40 and the n-type contacts 45. A dielectric layer 50 of, e.g., silicon oxide is interposed between the two ITO contact layers.

Arrow 55 in FIG. 10 indicates a direction of current injection, utilizing the ITO contact layers, for operation as, e.g., a photo-emissive device.

Figure 11:
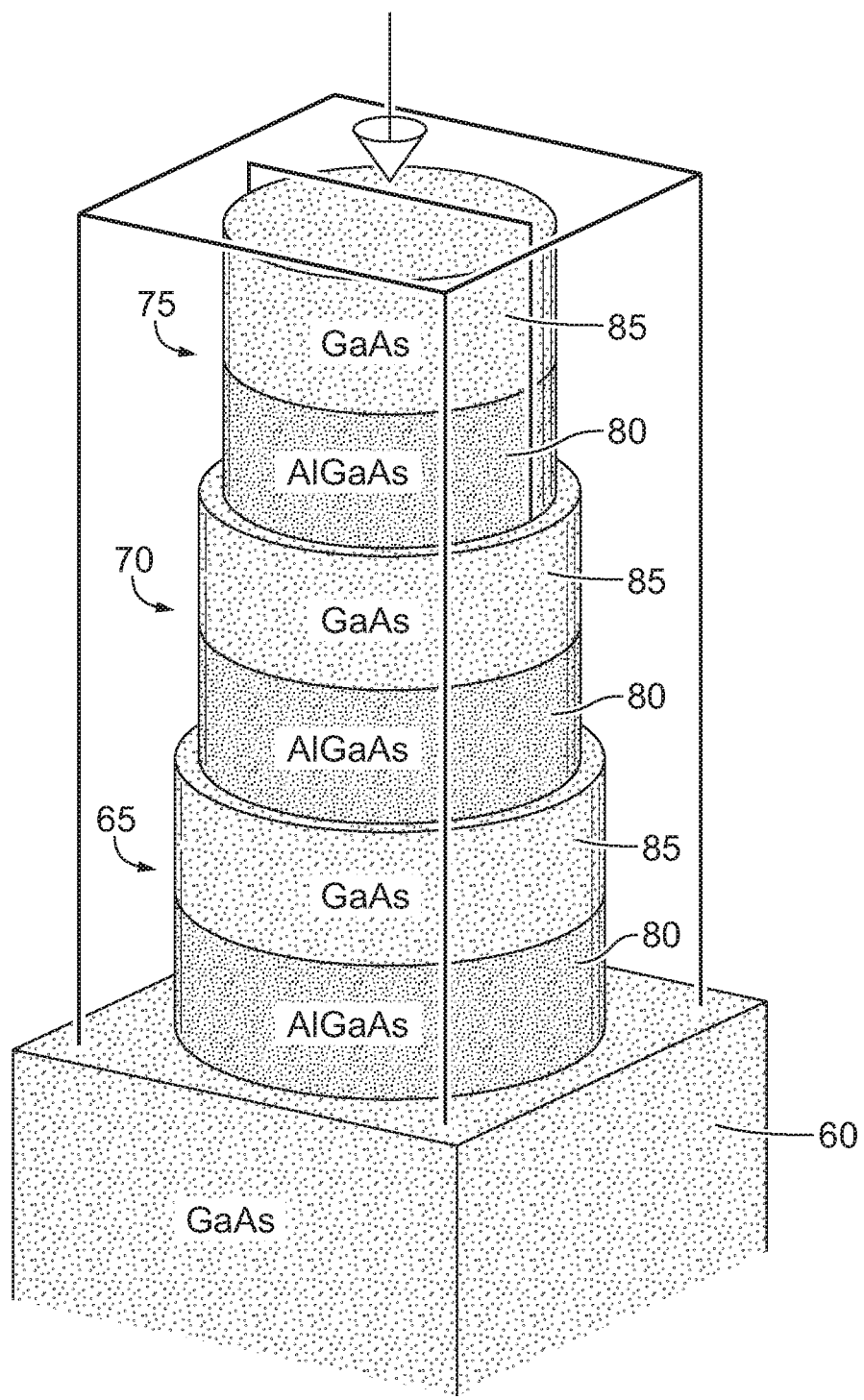
FIG. 11 is a schematic perspective drawing of a unit cell of a three-dimensional resonant array in which three resonator structures are epitaxially grown in a stack.

Although the preceding discussion has been directed to two-dimensional arrays of resonators, it should be understood that three-dimensional arrays are also feasible and within the scope of the present invention. Using epitaxial growth techniques, columns can be fabricated in which two or more resonator structures are stacked one above the other. FIG. 11 provides an example of such a column. As seen in the figure, a gallium arsenide substrate 60 is overlain by a column consisting of bottom resonator 65, middle resonator 70, and top resonator 75. Each of the three resonators includes an AlGaAs base layer 80 and a GaAs active layer 85. Although not shown in the figure, each GaAs active layer may be a host layer that contains a quantum-well multilayer as described above.

Example 1: Fabrication of GaAs Two-Dimensional Arrays

We fabricated GaAs two-dimensional dielectric resonator arrays using a combination of high-aspect-ratio etching and selective wet oxidation of AlGaAs under-layers to form a low refractive index oxide, i.e. native $(Al_xGa_{1-x})_2O_3$ having a refractive index of about 1.6. As described in Example 2, below, we also used the same fabrication processes to demonstrate three-dimensional GaAs dielectric resonator arrays.

Our selective wet oxidation technique was adapted from a technique previously reported for forming current-blocking layers in vertical-cavity surface-emitting lasers. The earlier technique was reported, e.g., in the paper by K. D. Choquette et al., cited above.

Figure 12:
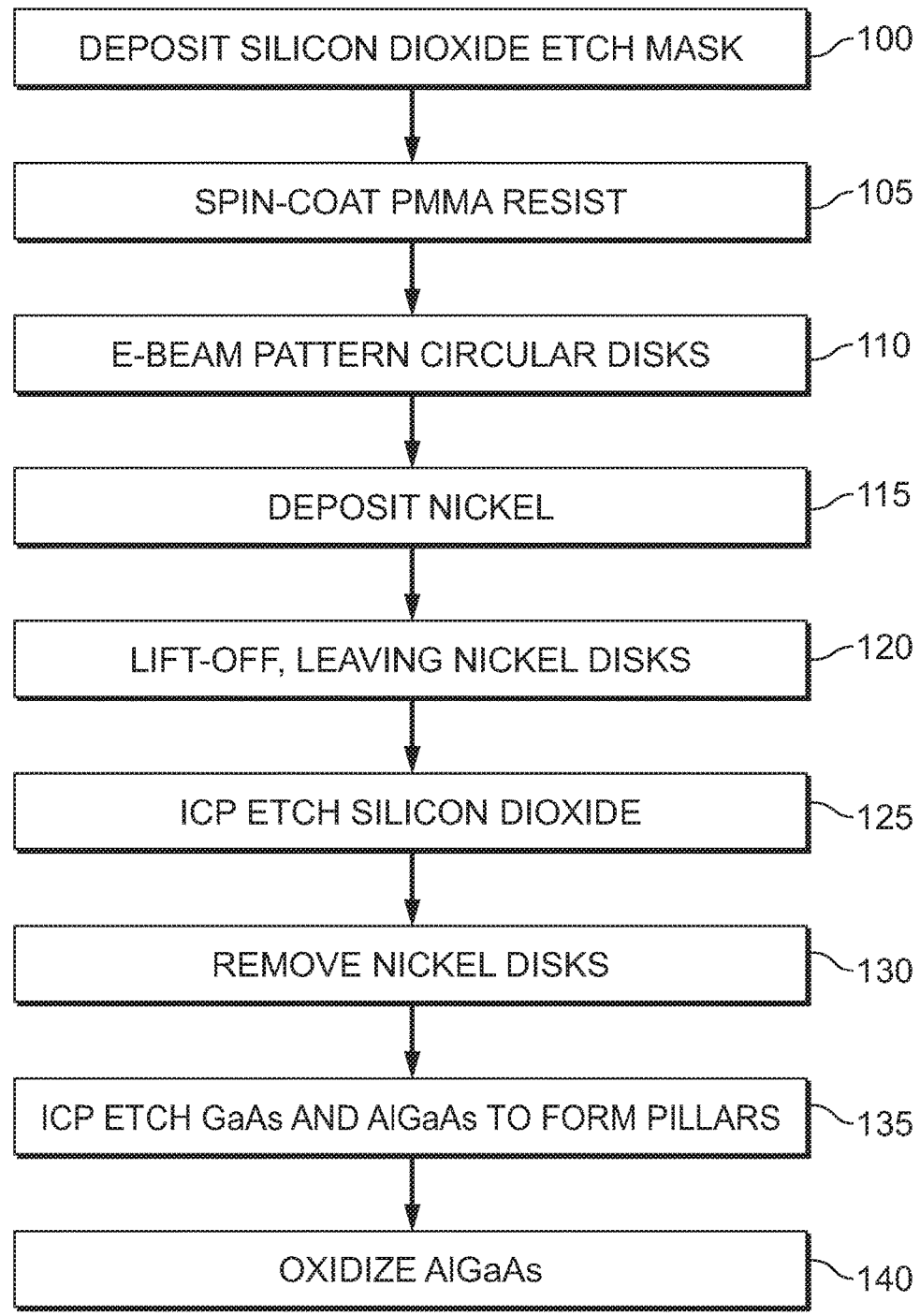
FIG. 12 is a flowchart of a process for creating an array of gallium arsenide resonators, starting from a multilayer wafer.

FIG. 12 shows the process flow for creating GaAs resonators starting from a wafer, grown by molecular beam epitaxy (MBE), that consisted of a semi-insulating GaAs substrate onto which a 300-nm layer of $Al_{0.85}Ga_{0.15}As$ was deposited followed by a 300 nm layer of GaAs.

At step 100, we deposited a few hundred nanometers of silicon dioxide (SiO2) to use as an etch mask. At step 105, we next spin-coated a positive tone polymethyl methacrylate (PMMA) resist. At step 110, we patterned circular disks using standard electron-beam lithography.

At step 115, after the development of the PMMA, a 10-20 nm layer of nickel was deposited. At step 120, this was followed by a lift-off process resulting in thin nickel disks. At step 125, the shape of the nickel disks was transferred onto the $SiO_2$ layer using inductively-coupled-plasma (ICP) etching. At step 130, the nickel disks were then removed using nitric acid, leaving only the $SiO_2$ disks as an etch mask for GaAs. Silicon dioxide was desirable for use as an etch mask because under the chlorine-based ICP etch that we used in the following step, silicon dioxide etches more than five times more slowly than GaAs or AlGaAs.

At step 135, we used an optimized, chlorine-based ICP etch recipe to create pillars of GaAs and AlGaAs having smooth vertical side walls. At step 140, the workpiece was placed in a tube furnace at about 420° C. for selective wet oxidization of the AlGaAs layers. A nitrogen carrier gas was used to transport water vapor across the sample, converting the layers of AlGaAs into their native oxide, i.e., low-index $(Al_xGa_{1-x})_2O_3$.

FIGS. 13A-13F provide schematic perspective views of the workpiece at several successive stages in the process of FIG. 12. In the figures, reference numerals 150, 155, and 160 respectively indicate the GaAs substrate, the AlGaAs layer, and the upper GaAs layer of the workpiece wafer. Reference numeral 165 indicates the silicon dioxide layer used as an etch mask. Reference numeral 170 indicates the PMMA resist. Reference numeral 175 indicates the nickel disks. Reference numeral 180 indicates the etched AlGaAs layer after oxidation to $(Al_xGa_{1-x})_2O_3$.

Figure 13A:
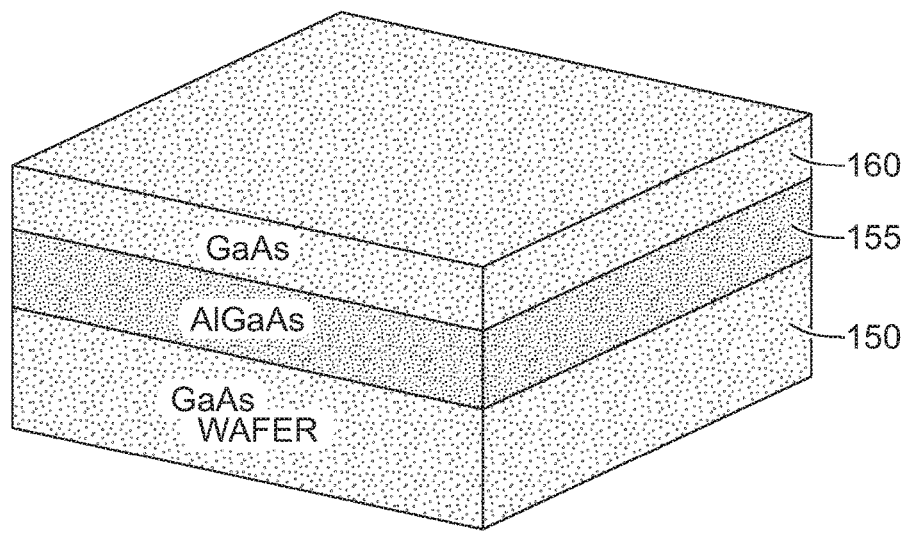
FIGS. 13A-13F provide schematic perspective views of a workpiece at several successive stages in the process of FIG. 12.
Figure 13B:
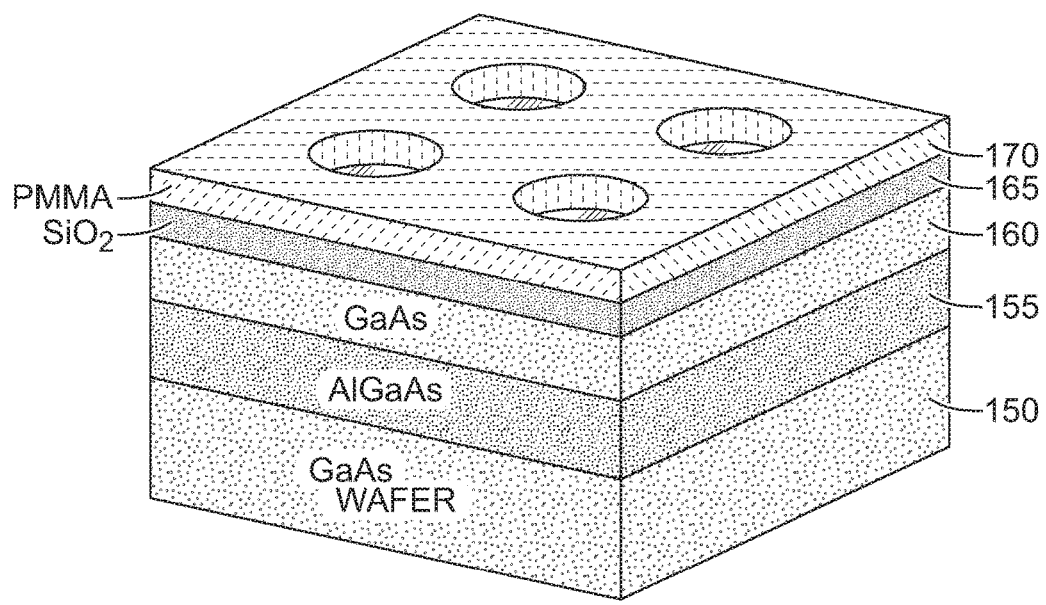
Figure 13C:
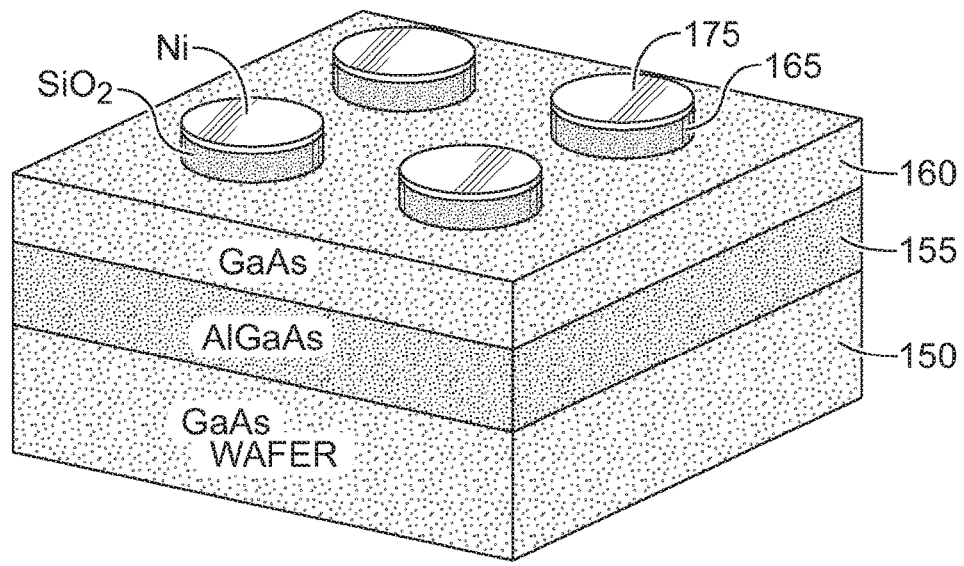
Figure 13D:
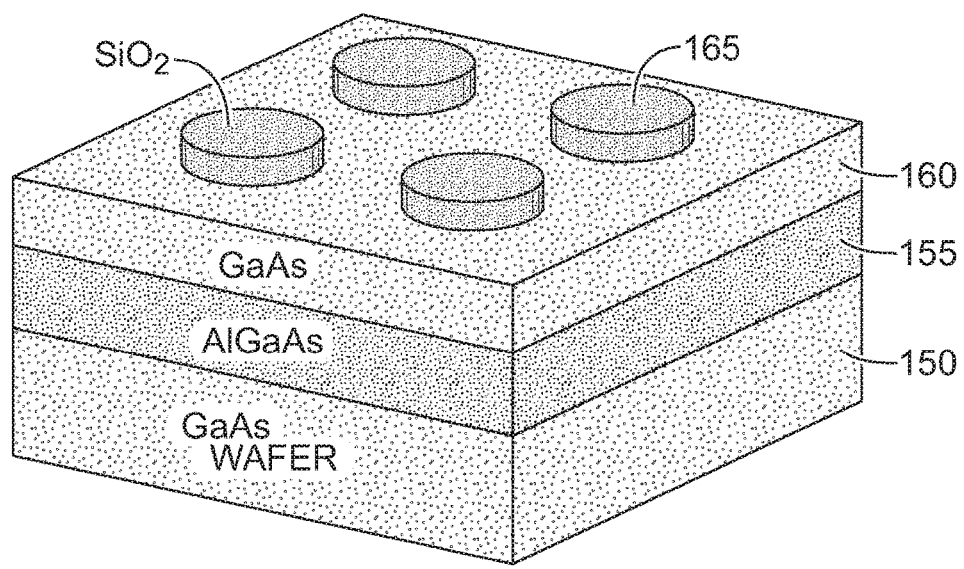
Figure 13E:
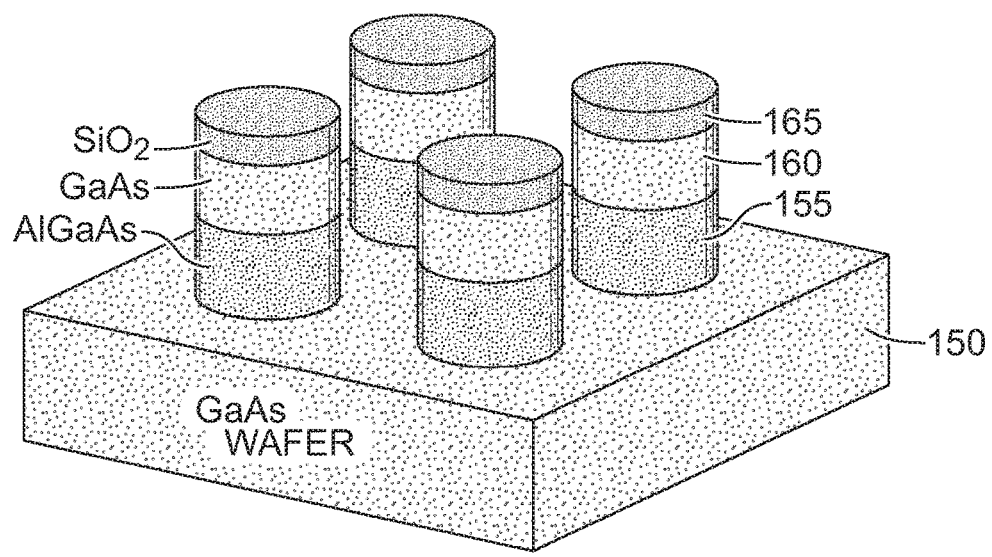
Figure 13F:
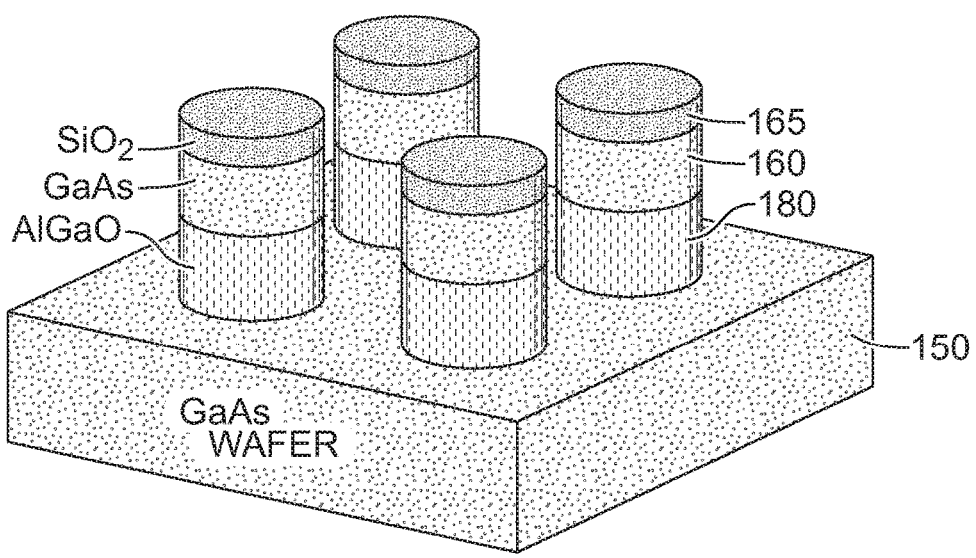

FIG. 13A shows the initial wafer. FIG. 13B shows the workpiece after step 110. FIG. 13C shows the workpiece after step 125. FIG. 13D shows the workpiece after step 130. FIG. 13E shows the workpiece after step 135. FIG. 13F shows the workpiece after step 140.

In a modified version of the process of FIG. 12, we used an etch mask of hydrogen silsesquioxane (HSQ) in place of PMMA and silicon dioxide. This was a simpler process that produced similar results to the process of FIG. 12. In the modified process, steps 100 and 115-130 were omitted. Instead, HSQ instead of PMMA was deposited by spin coating at step 100. At step 110, we patterned circular disks in the HSQ using standard electron-beam lithography. The rest of the process was as described above. The HSQ that we used was Fox® 16 Flowable Oxide from the Dow Corning corporation. The thickness of the HSQ layer affects the etch depth that can be achieved. At the viscosity of undiluted HSQ, we deposited a layer of HSQ about 300 nm thick, which allowed an etch depth of about 3 µm.

It should be noted that the GaAs resonator layers 160 can be replaced with AlGaAs layers, provided the aluminum concentration of the resonator layers is at least about 20% lower than that of the oxidation layers 155. The oxidation rate increases exponentially with aluminum concentration, hence if the aluminum concentration in resonator layer 160 is low enough, that layer will remain mostly unchanged while the underlayer is completely oxidized.

An AlGaAs dielectric resonator layer 160 has beneficial applications because it can provide Mie resonances in the visible spectrum. That is, $Al_{0.45}Ga_{0.55}As$ has a direct bandgap at 624 nm, but it transitions into an indirect bandgap material when the aluminum concentration exceeds 45%.

Our fabrication technique, including the oxidation step, can be applied to other aluminum-containing semiconductors, such as aluminum indium arsenide and aluminum indium gallium phosphide.

Scanning-electron microscopy (SEM) imaging of the fabricated columns showed that they formed with smooth and slightly tapered vertical sidewalls. The sidewall angle could be optimized by modifying etch parameters such as ICP power and reactive ion etch (ME) power.

We measured the reflectivity spectra of GaAs dielectric resonator arrays fabricated as described above, having a thickness of 300 nm and diameters of 260 nm, 300 nm, 340 nm, and 360 nm. Since the GaAs resonator heights are fixed by the thicknesses of the epitaxially grown layers, we tuned the wavelengths of the dipole resonances by varying the array pitch together with the column diameters. The duty cycle was held constant at about 40%. "Duty cycle" in this regard is defined as the ratio of column diameter to array pitch.

The measured spectra agreed well with FDTD simulations assuming a dispersionless refractive index of 1.6 for the native oxide layer. Each measured spectrum exhibited two reflectivity peaks corresponding respectively to the magnetic and electric dipole resonances, and shifting to longer wavelengths with increasing resonator diameter. The appearance of well-separated electric and magnetic dipole resonances confirmed that there was a fully oxidized spacer layer separating the GaAs nanodisk resonators from the high index substrate.

Figure 14:
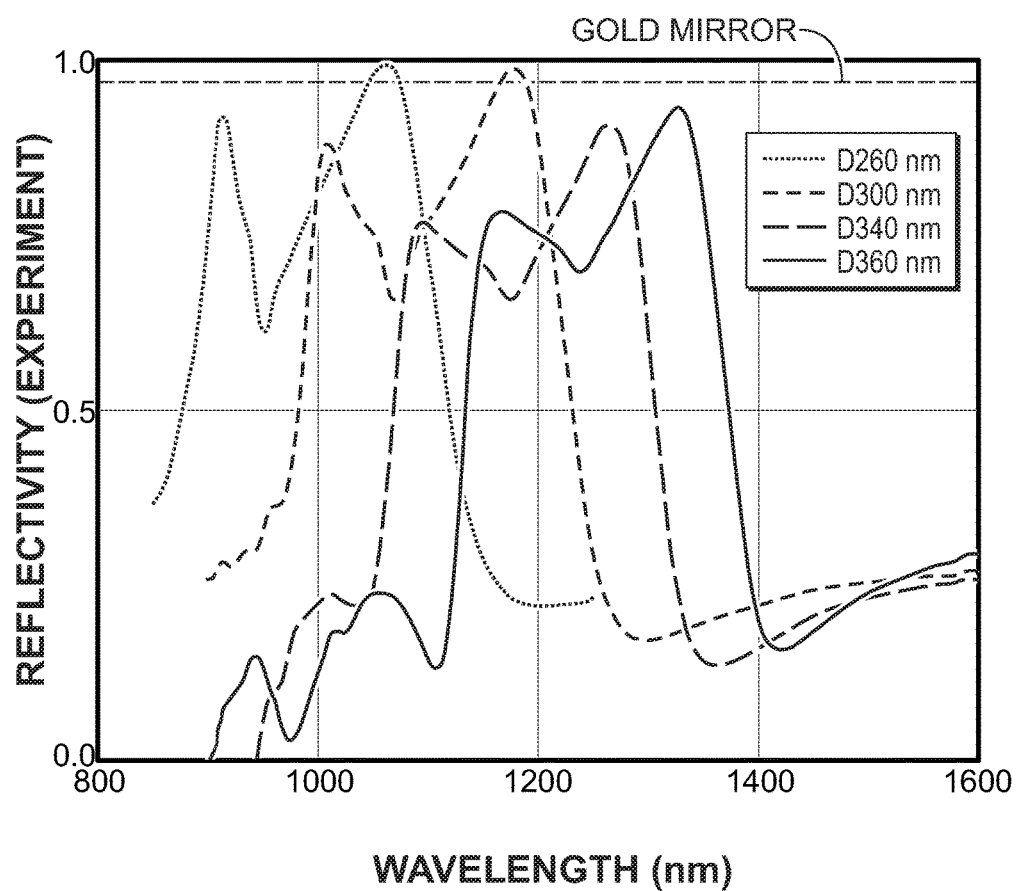
FIG. 14 is a plot of four experimentally measured reflectivity spectra taken on dielectric resonator arrays fabricated by the process of FIG. 12. Each spectrum relates to an array of columns having a respective diameter.

FIG. 14 is a plot of the four experimentally measured reflectivity spectra, normalized to the reflectivity of a gold mirror as measured under identical conditions.

More information about our fabrication method and designs may be obtained from the article, Sheng Liu et al., "III-V semiconductor nano-resonators—a new strategy for passive, active, and nonlinear all-dielectric metamaterials," published online at arXiv:1605.00298 [physics.optics] (2016), the entirety of which is hereby incorporated herein by reference for all purposes.

Example 2: Fabrication of Multilayer Arrays

As mentioned above, fabricating three-dimensional dielectric metamaterials is possible using the techniques described here. By "three dimensional" structures we mean stacked multilayer structures (which are sometimes referred to as "quasi-three-dimensional"), as well as other kinds of structures that repeat in the direction perpendicular to the substrate.

To demonstrate the ability to produce multilayer dielectric resonator arrays, we fabricated monolithic arrays of columns on a GaAs substrate, in which each column contained three instances of the $(Al_xGa_{1-x})_2O_3$—GaAs pattern described above in Example 1. That is, the sequence of layers in each column, from the bottom up, was $GaAs/(Al_xGa_{1-x})_2O_3/GaAs/(Al_xGa_{1-x})_2O_3/GaAs/(Al_xGa_{1-x})_2O_3/GaAs$. Our fabrication process was as described above in Example 1, except that the initial wafer had three layers of GaAs separated by three layers of AlGaAs.

Figure 15:
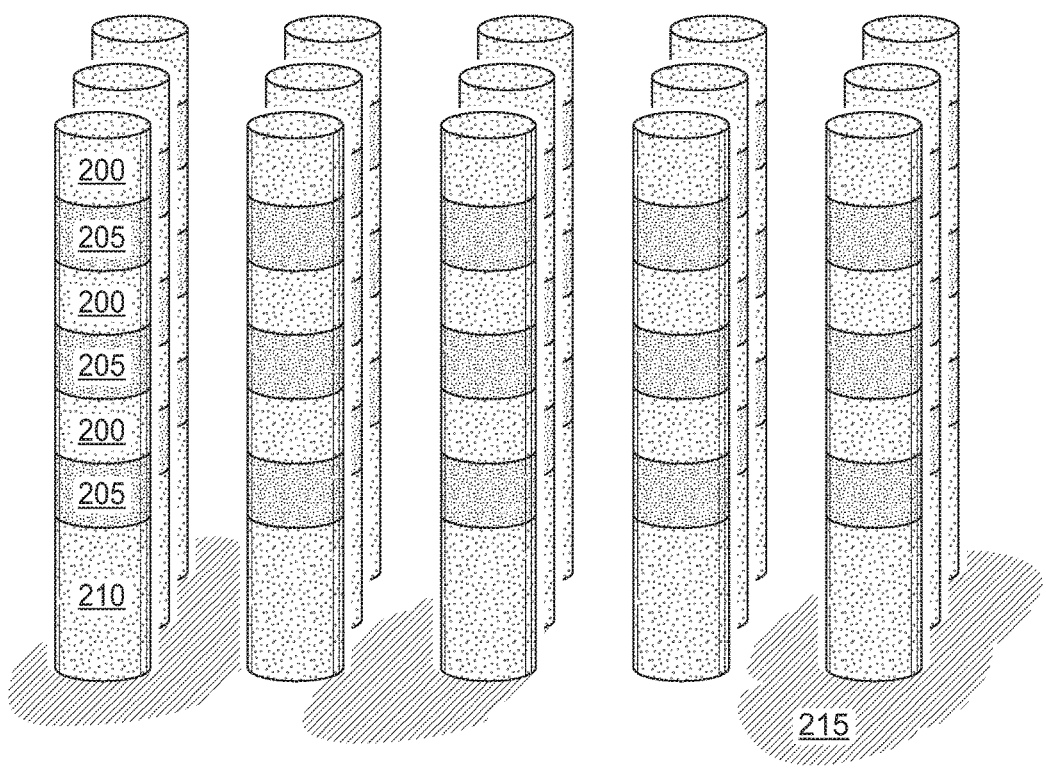
FIG. 15 provides a view, based on a scanning electron microscope (SEM) image, of an example three-dimensional resonator array fabricated according to methods described here.

FIG. 15 provides a view, based on a scanning electron microscope (SEM) image, of an example of the resulting structure. Visible in each column are three approximately 300-nm-thick GaAs resonator layers 200, three approximately 300-nm-thick oxidized layers 205, a GaAs layer 210 at the base of each column, and the GaAs substrate 215. A scale bar in the figure indicates an interval of 1 µm.

The columns had a high aspect ratio, with a height somewhat greater than 2 µm and an average diameter of about 350 nm or somewhat more. The structure was fabricated with a single-step ICP etch, since both AlGaAs and GaAs are etchable under the same conditions. We believe that even greater numbers of layers can be included in structures of this kind. The number of layers in the initial wafer is ultimately limited by the limitations of epitaxial growth. Other limits are practical limits imposed by the thickness of etch mask, the etching conditions, and the demands on the structural strength of the semiconductor materials for supporting the resulting high aspect ratio structures.

With further reference to FIG. 15, it will be seen that the columns are slightly tapered with a diameter of about 350 nm at the top and about 370 nm at the bottom. We believe that by adjusting the etching conditions, we can control the taper angle of the multilayer structure so that the gallium arsenide resonator layers at each respective level within the columns can have a distinct diameter. This can lead to a different resonant wavelength for the resonators at each respective level.

The measured reflectivity spectrum of the three-layer array of FIG. 15 agreed well with the FDTD simulation and clearly indicated the presence of the electric and magnetic dipole resonances seen in the single-layer array and described above.

Figure 16:
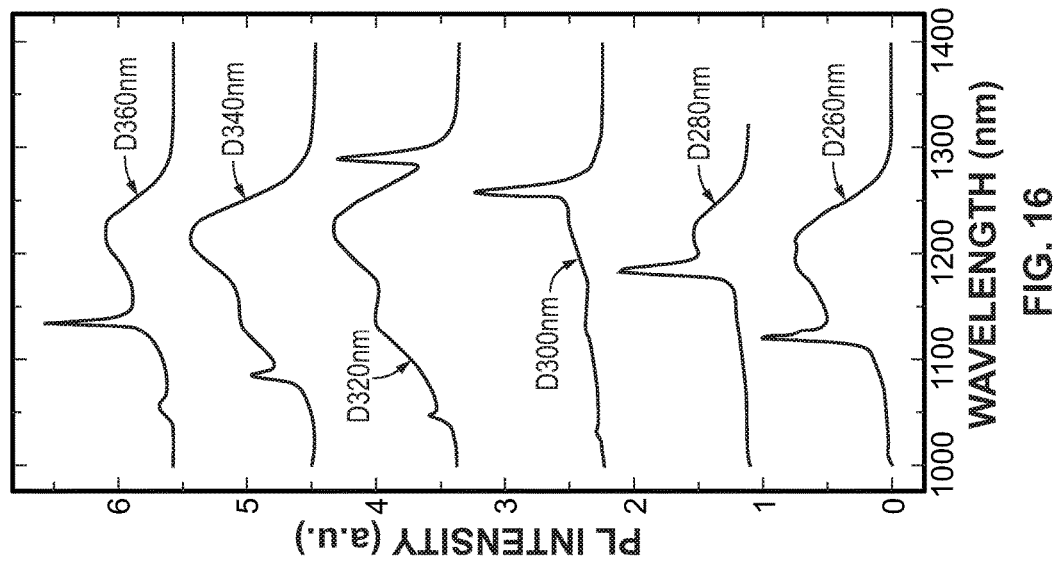
FIG. 16 is a plot of six experimentally measured photoluminescent emission spectra of dielectric resonator arrays of the kind in which a gallium arsenide resonator layer includes a GaAs—InAs quantum dot multilayer. The dielectric resonators were cylindrical. Each spectrum corresponds to a respective cylinder diameter.

Example 3: Observation of Optical Transitions in Quantum Dots Multilayers in Cylindrical Resonators FIG. 16 is a plot of six experimentally measured photoluminescent emission spectra of dielectric resonator arrays of the kind in which a gallium arsenide resonator layer includes a GaAs—InAs quantum dot multilayer. The dielectric resonators were cylindrical. Each spectrum corresponds to a respective cylinder diameter and pitch of the array.

The fluorescence was excited by optical pulses at about 850 nm.

Each of the spectra displays an emission peak at a respective wavelength determined by the resonator dimensions. As seen in the figure, a sharp emission peak occurs at the following wavelengths: for a cylinder diameter of 260 nm, about 1.120 μm; for a cylinder diameter of 280 nm, about 1.170 μm; for a cylinder diameter of 300 nm, about 1.250 μm; for a cylinder diameter of 320 nm, about 1.300 μm. When the cylinder diameter reaches 340 nm, a new resonance emerges, having a sharp emission peak at about 1.100 μm. For a cylinder diameter of 360 nm, the new emission peak shifts to about 1.150 μm.

Also, visible in the six spectral curves of FIG. 16 is a broad peak, which we believe corresponds to the emission band of the quantum dot multilayer.

Figure 17:
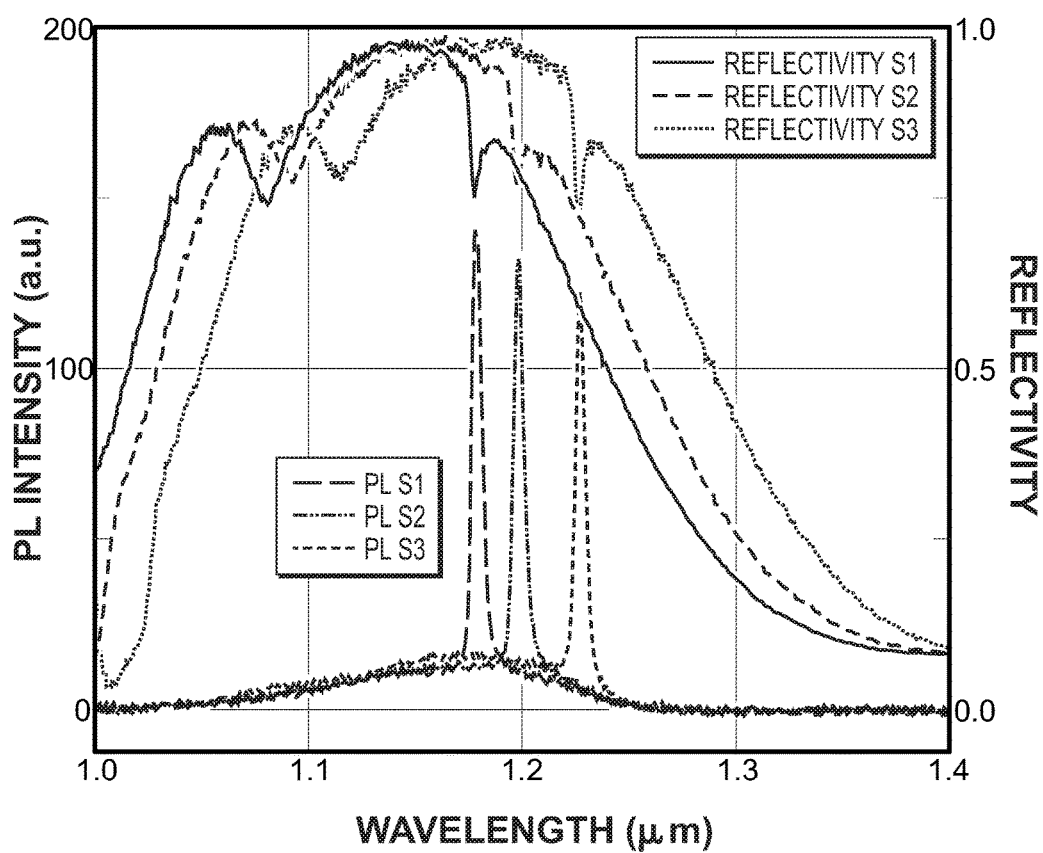
FIG. 17 is a plot of three experimentally measured photoluminescent emission spectra and three experimentally measured reflectivity spectra of dielectric resonator arrays of the kind in which a gallium arsenide resonator layer includes a GaAs—InAs quantum dot multilayer. The dielectric resonators were cubes, each having a cut-out corner. Each spectrum corresponds to a respective side length of the cube.

Example 4: Observation of Optical Transitions in Quantum Dot Multilayers in Fano Resonators FIG. 17 is a plot of three experimentally measured photoluminescent emission spectra and three experimentally measured reflectivity spectra of dielectric resonator arrays of the kind in which a gallium arsenide resonator layer includes a GaAs—InAs quantum dot multilayer. The dielectric resonators were cubes, each having a cut-out corner. Each photoluminescence spectrum and each reflectivity spectrum corresponds to one of the three samples, which are respectively denominated S1, S2, and S3. The side length of the cube and the pitch of the array were varied from sample to sample.

Figure 18:
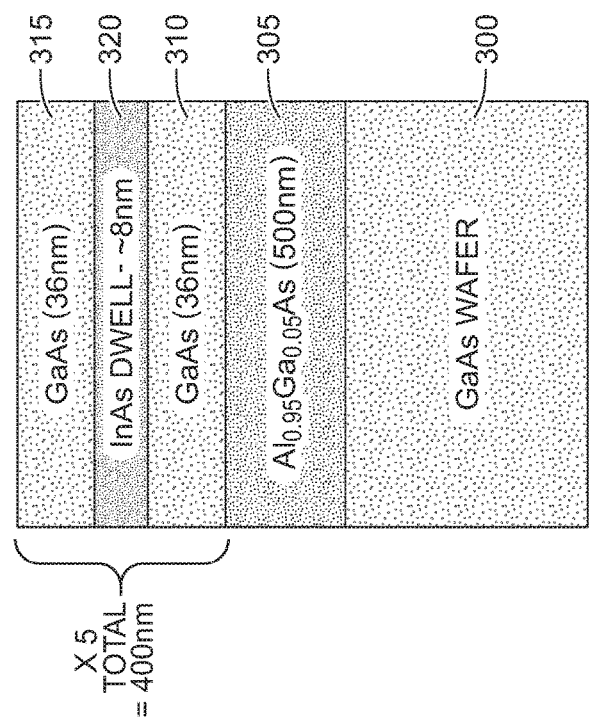
FIG. 18 is a schematic cross-sectional view illustrating the multilayer design of the resonators of FIG. 17.

The multilayer design is illustrated in FIG. 18. As seen there, the GaAs substrate 300 was overlain by a 500-nm layer 305 of $Al_{0.95}Ga_{0.05}As$. Over layer 305 we deposited a multilayer having a total thickness of 400 nm. One unit of the multilayer is shown in the figure. The unit was repeated five times. As shown, each unit consisted of two 36-nm barrier layers 310, 315 of GaAs, with an InAs quantum-dot well layer 320 included between them. The InAs layer was about 8 nm thick.

The fluorescence was excited by optical pulses at about 850 nm.

The photoluminescence spectra display a sharp peak at 1.18 μm for sample S1, at 1.20 μm for sample S2, and at 1.23 μm for sample S3. We attribute these peaks to the Fano resonance corresponding to the magnetic dipole.

Each of the reflectivity spectra shows a reflectivity greater than 70% over a band that is 0.18 μm or more in width. Within that band, each spectrum displays a narrow dip aligned with the corresponding peak in the emission spectrum. Each reflectivity spectrum also displays a broader dip near a wavelength of 1.1 μm. We attribute those dips to the Fano resonance corresponding to the electric dipole.

What is claimed is:

1. An active optical apparatus comprising a substrate and an optical metamaterial, wherein:
    the optical metamaterial comprises a regular two-dimensional array of vertical columns overlying the substrate;
    each of the vertical columns comprises a layered structure of semiconductor material;
    each said layered structure includes a quantum-well multilayer and has an effective refractive index;
    each said layered structure is underlain by an optical confinement layer;
    each said optical confinement layer comprises a confinement material that has a refractive index lower than the effective refractive index of the layered semiconductor structure that overlies it;
    each of the vertical columns is conformed to provide at least one dielectric resonator having an optical resonance at a frequency f, said at least one dielectric resonator dimensioned in three dimensions to provide a Mie resonance that lies substantially at the frequency f; and
    each quantum-well multilayer constitutes an active medium characterized by at least one optical transition whereby light is emitted and/or absorbed with the frequency f.

2. The apparatus of claim 1, wherein the vertical columns are conformed as circular cylinders.

3. The apparatus of claim 1, wherein the quantum-well multilayers are conformed as quantum-dot multilayers.

4. The apparatus of claim 1, wherein the substrate comprises gallium arsenide.

5. The apparatus of claim 1, wherein the substrate comprises gallium arsenide and the vertical columns comprise gallium arsenide.

6. The apparatus of claim 1, wherein the substrate comprises gallium arsenide and the confinement material comprises an oxide of aluminum gallium arsenide.

7. The apparatus of claim 1, wherein the quantum-well multilayers each comprise alternating layers of gallium arsenide and indium arsenide.

8. The apparatus of claim 1, wherein each quantum well multilayer is enclosed between an underlying base layer and an overlying cap layer.

9. The apparatus of claim 1, wherein each quantum well multilayer is enclosed between an underlying base layer and an overlying cap layer, and wherein the substrate, the base layer, and the cap layer are composed of gallium arsenide.

10. The apparatus of claim 1, wherein:
    the active medium for each of the dielectric resonators in the array is enclosed between an underlying base layer and an overlying cap layer of semiconductor material; and
    the apparatus further comprises an electrically conductive lower contact layer adjacent to the base layers and an electrically conductive upper contact layer adjacent to the cap layers.

11. The apparatus of claim 1, wherein:
    the active medium for each of the dielectric resonators in the array is enclosed between an underlying base layer and an overlying cap layer of semiconductor material;
    the apparatus further comprises an electrically conductive lower contact layer adjacent to the base layers and an electrically conductive upper contact layer adjacent to the cap layers; and
    the substrate, the base layers, and the cap layers are composed of gallium arsenide.

12. An active optical apparatus comprising a substrate and an optical metamaterial, conformed as a three-dimensional resonator array, wherein:
    the optical metamaterial comprises a regular two-dimensional array of vertical columns overlying the substrate;
    each of the vertical columns comprises a layered structure of semiconductor material;
    each said layered structure includes a quantum-well multilayer and has an effective refractive index;
    each said layered structure is underlain by an optical confinement layer;

each said optical confinement layer comprises a confinement material that has a refractive index lower than the effective refractive index of the layered semiconductor structure that overlies it;

each of the vertical columns is conformed to provide at least one dielectric resonator having an optical resonance at a frequency f;

each quantum-well multilayer constitutes an active medium characterized by at least one optical transition whereby light is emitted and/or absorbed with the frequency f;

each of the vertical columns is conformed to provide two or more of the dielectric resonators that have an optical resonance at the frequency f;

the said two or more dielectric resonators within each vertical column are separated from each other by intervening layers of the confinement material; and each of the said dielectric resonators includes a quantum-well multilayer.

\* \* \* \* \*